(12) United States Patent
Zhou et al.

(10) Patent No.: US 8,202,109 B2
(45) Date of Patent: Jun. 19, 2012

(54) ELECTRICAL CONNECTOR WITH IMPROVED CAM ACTUATOR

(75) Inventors: Yang Zhou, Shenzhen (CN); Hui Ye, Shenzhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/917,467

(22) Filed: Nov. 1, 2010

(65) Prior Publication Data
US 2011/0104928 A1    May 5, 2011

(51) Int. Cl.
*H01R 13/625* (2006.01)
(52) U.S. Cl. .................................. 439/342; 439/259
(58) Field of Classification Search ............ 439/342, 439/259–270
See application file for complete search history.

(56) References Cited

U.S. PATENT DOCUMENTS

| | | | |
|---|---|---|---|
| 6,250,941 B1 * | 6/2001 | Huang et al. | 439/342 |
| 6,254,415 B1 | 7/2001 | Mizumura et al. | |
| 6,280,224 B1 | 8/2001 | Huang | |
| 6,296,507 B1 | 10/2001 | Huang | |
| 6,338,640 B1 | 1/2002 | Lin | |
| 6,450,825 B1 * | 9/2002 | Huang | 439/342 |
| 6,450,827 B1 * | 9/2002 | Huang et al. | 439/342 |
| 6,475,013 B1 * | 11/2002 | Pang et al. | 439/342 |
| 6,500,019 B1 * | 12/2002 | Tan | 439/342 |
| 6,669,498 B2 * | 12/2003 | Okita et al. | 439/342 |
| 7,056,140 B1 * | 6/2006 | Jiang | 439/342 |
| 7,094,090 B2 * | 8/2006 | He et al. | 439/342 |

FOREIGN PATENT DOCUMENTS

CN    2559117 Y    7/2003

* cited by examiner

*Primary Examiner* — Thanh Tam Le
(74) *Attorney, Agent, or Firm* — Andrew C. Cheng; Wei Te Chung; Ming Chieh Chang

(57) ABSTRACT

An electrical connector includes an insulative base, a cover mounted on the base, a number of conductive terminals secured to the base, and a cam actuator extending through said cover and base to actuate the cover to slide on the base. The cam actuator includes a retention disk, a central disk, a cam disk, a transition disk, and a driving disk from down to up. The retention disk and the central disk are coaxial and located in the base. The cam disk, the transition disk, and the driving disk are coaxial and located in the cover. The cam actuator rotates on axis of the central disk. The axis of the cam disk is parallel to but offset from the axis of the central disk. The diameter of the transition disk is less than the diameter of the driving disk and more than the diameter of the cam disk.

14 Claims, 5 Drawing Sheets

ELECTRICAL CONNECTOR WITH IMPROVED CAM ACTUATOR

BACKGROUND OF THE INVENTION

1. Field of the Invention

The present invention relates to an electrical connector for electrically connecting a central processing unit (CPU) with a printed circuit board (PCB), and particularly to an electrical connector with a cam actuator.

2. Description of Related Art

Central Process Unit (CPU) sockets are widely used in personal computer systems to electrically connect CPU with Printed Circuit Board (PCB), such CPU socket is disclosed in "BGA Socket: a dendritic solution" (P460-P466,1996 IEEE 46.sup.th Electronic Components & Technology Conference). Generally, CPU socket is manufactured to have a cam actuator. U.S. Pat. Nos. 6,250,941, 6,254,415, 6,280,224, 6,296,507 and 6,338,640 all disclose conventional cam actuators used in CPU sockets.

China Pat. Issue No. 2559117Y issued to Foxconn discloses a CPU socket with a cam actuator which comprises an insulative base, a cover, a plurality of conductive terminals received in the base, a cam actuator, a protecting mechanism and a washer. The cover is slidably mounted on the base. The actuator can actuate the cover to slide along the base. The protecting mechanism comprises a cover plate retained in the cover, and a base plate received in the base. The cover plate and the base plate respectively comprise a pair of guiding blocks, and a pair of guiding slots movably receiving the guiding blocks. When the actuator actuates the cover to slide along the base, the protecting mechanism prevents or minimizes rotation between the cover plate and the base plate.

Generally, the cam actuator comprises four cylindrical portions formed one on the other. The cylindrical portions progressively decrease in diameter from top to bottom. During molding of the cam actuator, the diameter of the cylindrical portion is bigger, the flow of the raw materials in the die is easier. Then, the life of the die core will extend. However, a disadvantage appears with the diameters' growth, that is, the torsion of the socket is also increased which is difficult to operate.

An improved CPU socket that overcomes the above-mentioned problems is desired.

BRIEF SUMMARY OF THE INVENTION

An object of the present invention is to provide an electrical connector with low cost.

An electrical connector comprises an insulative base, a cover mounted on the base and defining a plurality of passageways, a plurality of conductive terminals secured to the base and disposed in the corresponding passageways of the cover, respectively, and a cam actuator extending through said cover and base to actuate the cover to slide on the base. The cam actuator includes a retention disk, a central disk, a cam disk, a transition disk, and a driving disk from down to up. The retention disk and the central disk are coaxial and located in the base. The cam disk, the transition disk, and the driving disk are coaxial and located in the cover. The cam actuator rotates on an axis of the central disk. An axis of the cam disk is offset from the axis of the central disk. The diameter of the transition disk is less than the diameter of the driving disk and more than the diameter of the cam disk.

An electrical connector comprises an insulative base, a cover mounted on the base and defining a plurality of passageways, a plurality of conductive terminals secured to the base and disposed in the corresponding passageways of the cover, respectively, and a cam actuator extending through said cover and base to actuate the cover to slide on the base. The cam actuator includes a retention disk, a central disk, a cam disk, a transition disk, and a driving disk from down to up. The retention disk and the central disk are coaxial and located in the base. The cam disk, the transition disk, and the driving disk are coaxial and located in the cover. The cam actuator rotates on an axis of the central disk. An axis of the cam disk is offset from the axis of the central disk. The cam disk contacts with the cover. A gap is formed between the transition disk and the cover.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
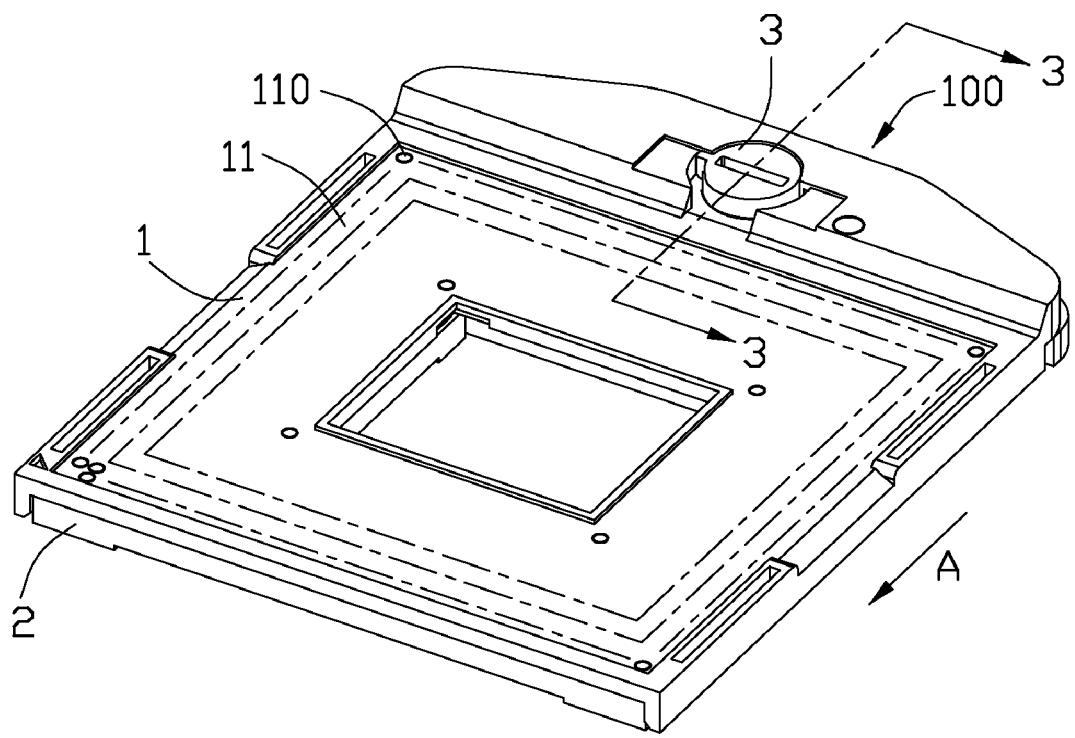
FIG. 1 is an assembled, isometric view of a CPU socket in accordance with a preferred embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Figure 3:
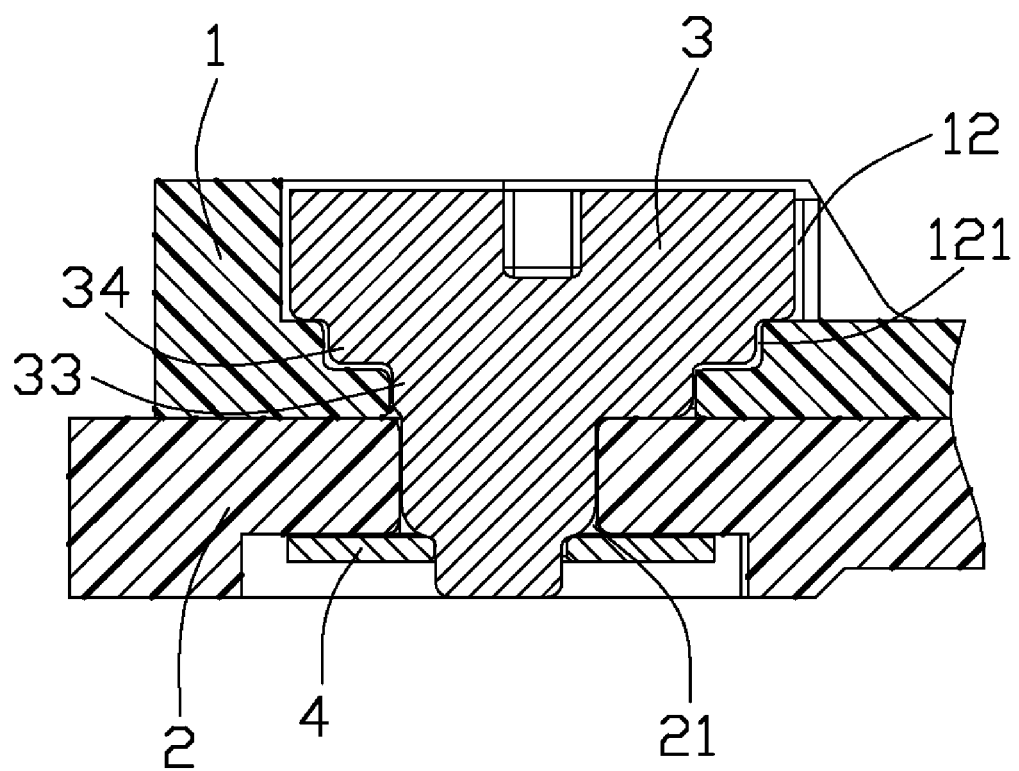
FIG. 3 is a cross-sectional view of the cam actuator of the CPU socket, taken along line 3-3 of FIG. 1.

Referring to FIGS. 1 and 3, an electrical connector 100 with a cam actuator 3 in accordance with a preferred embodiment of the present invention comprises an insulative base 2, and a cover 1 slidably engaged on the base 2. The base 2 is generally rectangular. A multiplicity of passageways 110 is recessed from a top surface 11 of the cover 1. The passageways 110 form a rectangular array, and a multiplicity of conductive terminals (not shown) is respectively received in the passageways 110. The cover 1 and base 2 each defines a recess 12, 21 at one end thereof for receiving the cam actuator 3.

Figure 2:
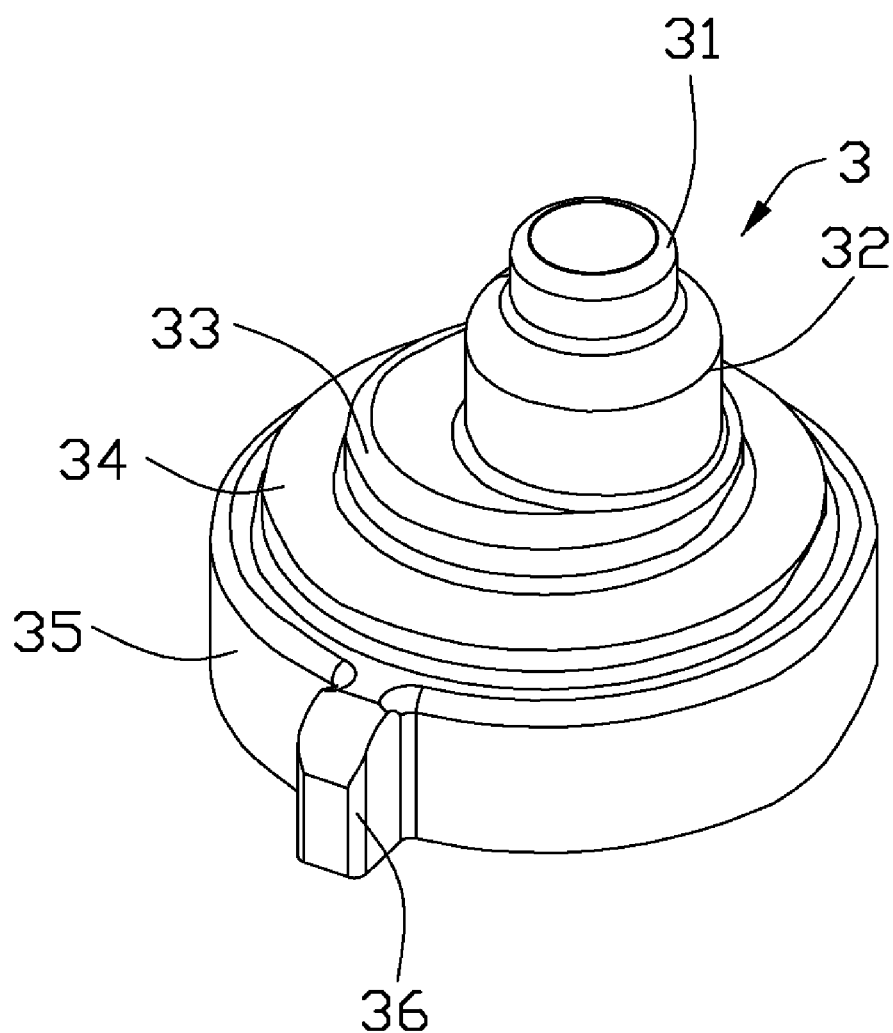
FIG. 2 is a perspective isometric view of the cam actuator of the CPU socket shown in FIG. 1.
Figure 4:
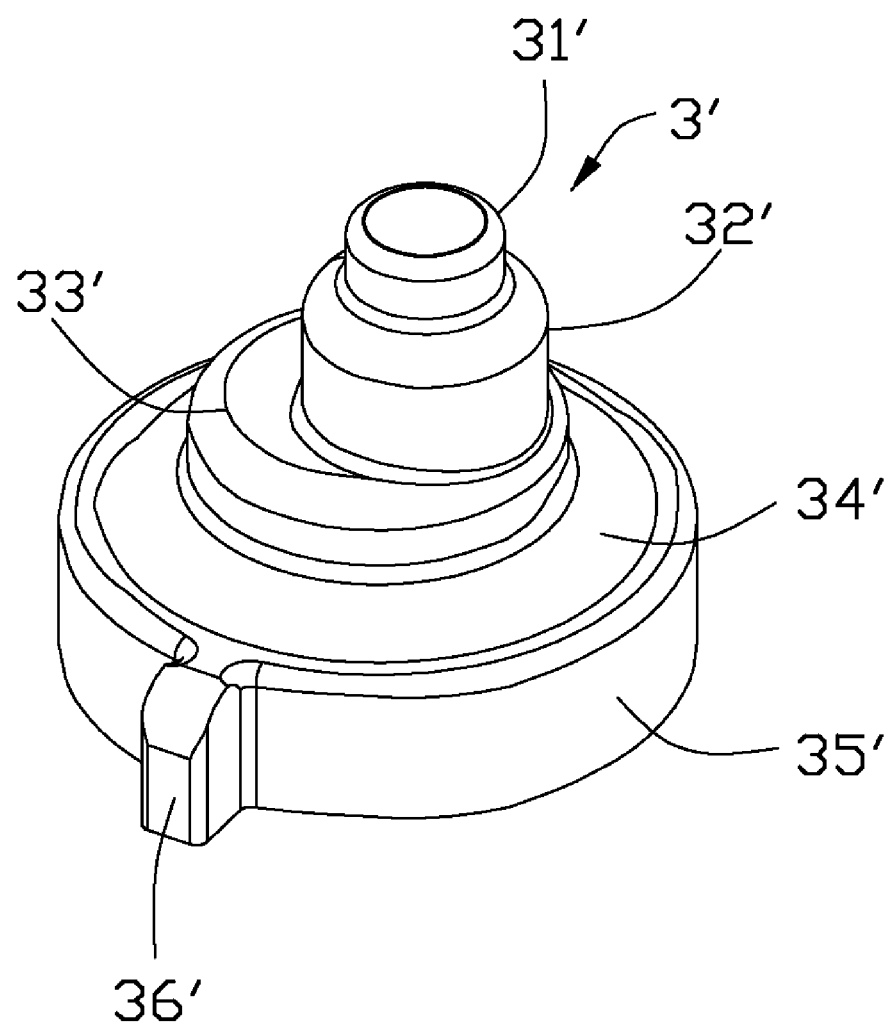
FIG. 4 is a perspective isometric view of the cam actuator of a CPU socket in accordance with a second preferred embodiment of the present invention.

Please referring to FIGS. 2 to 4, the cam actuator 3 includes a retention disk 31, a central disk 32, a cam disk 33, a transition disk 34, and a driving disk 35 from down to up. The disks progressively decrease in diameter from up to down. The retention disk 31 and the central disk 32 are located in the recess 21 of the base 2 and coaxial. The cam disk 33, the transition disk 34, and the driving disk 35 are coaxial and located in the recess 12. An axis of the central disk 32 is parallel to but offset from an axis of the cam disk 33. A lateral protrusion 36 protrudes from a circumferential periphery of the driving disk 35. A washer 4 engages with the retention disk 31 to secure the cam actuator 3 in the electrical connector 100.

In assembly, the cover 1 is attached on the base 2 and slides relative to the base 1 in the direction A. The cam actuator 3 is sequentially extended through the recesses 12, 21 and secured therein by the washer 4. Thus the base 2, the cover 1, and the actuator 3 are assembled together. The cam actuator 3 rotates on the axis of the central disk 32 thereby make the cam disk 33 serve as an eccentric cam to actuate the cover 1 move along the direction A. Contact pins of a Central Process Unit (CPU, not shown) can be inserted through the passages 110 of the cover 1 to engage with the terminals. Rotation of the protrusion 36 of the cam actuator 3 is restricted between an open position and a closed position. Thus a distance that the cover 1 can slide is limited.

During operating, the cam disk 33 contacts with the cover 1 thereby actuate the cover 1 to slide. However, there is a gap 121 between the transition disk 34 and the cover 1 which makes the transition disk 34 is idle when the cam actuator 3 rotates. Since the transition disk 34 is separated from the cover 1, it can be designed to have a bigger diameter than the cam disk 33 to improve the fluidity in the mold. Then, the mold life is extended so as to reduce the manufacture cost. In addition, the transition disk 34 is located between the driving disk 35 and the cam disk 33. The diameter of the cam disk 33 does not need to increase so as to keep the torsion of the cam actuator 3 at a normal level.

Figure 5:
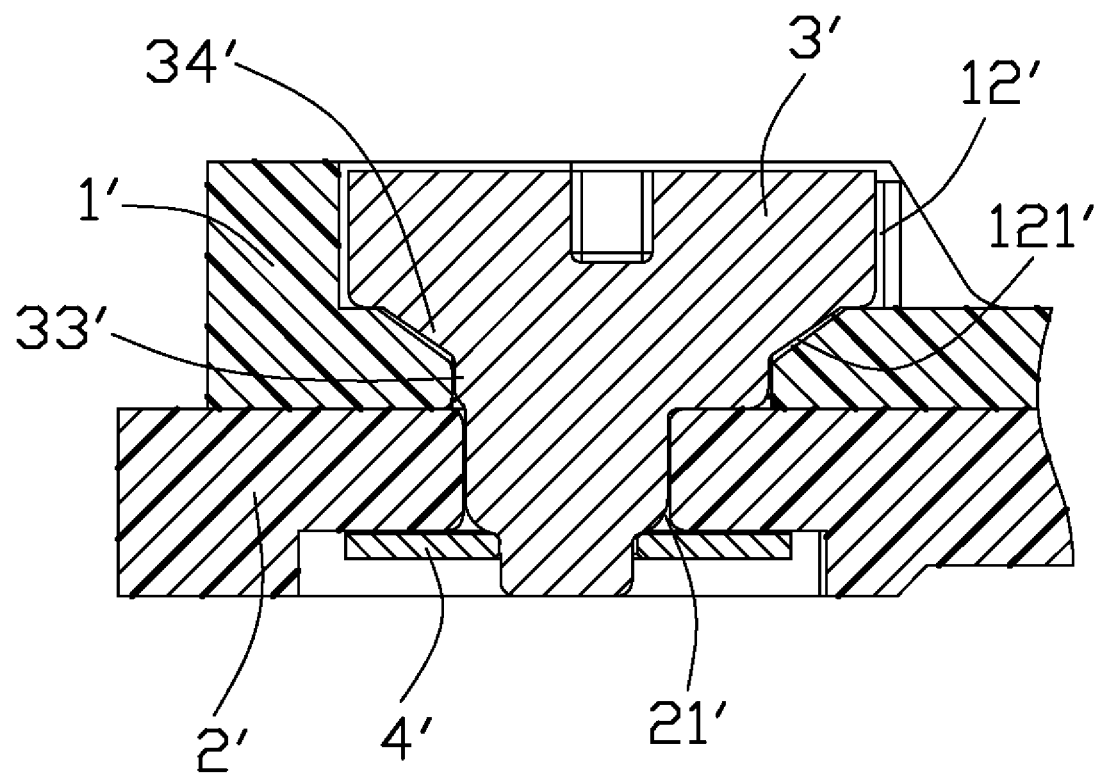
FIG. 5 is a partial cross-sectional view of the CPU socket shown in FIG. 4.

Please refer to FIGS. 5 and 7, which show a cam actuator 3' according to a second embodiment of the present invention. The cam actuator 3' also includes a retention disk 31', a central disk 32', a cam disk 33', a transition disk 34', and a driving disk 35' from down to up. The disks progressively decrease in diameter from up to down. The retention disk 31' and the central disk 32' are located in the recess 21' of the base 2' and coaxial. The cam disk 33', the transition disk 34', and the driving disk 35' are coaxial and located in the recess 12'. An axis of the central disk 32' is parallel to but offset from an axis of the cam disk 33'. A lateral protrusion 36' protrudes from a circumferential periphery of the driving disk 35'. A washer 4' engages with the retention disk 31' to secure the cam actuator 3'. In the first embodiment, the transition disk 34 has a cylinder surface. However, the transition disk 34' of the second embodiment has a circular conical surface.

During operating, the cam disk 33' contacts with the cover 1' thereby actuates the cover 1' to slide. However, there is a gap 121' between the transition disk 34' and the cover 1' so that the transition disk 34' is idle when the cam actuator 3' rotates. Since the transition disk 34' is separated from the cover 1', it can be designed to have a bigger diameter than the cam disk 33' to improve the fluidity in the mold. Then, the mold life is extended so as to reduce the manufacture cost. In addition, the transition disk 34' is located between the driving disk 35' and the cam disk 33', it dost not need to increase the diameter of the cam disk 33' and keep the torsion of the cam actuator 3' at a normal level.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector comprising:
   an insulative base;
   a cover mounted on the base and defining a plurality of passageways;
   a plurality of conductive terminals secured to the base and disposed in the corresponding passageways of the cover, respectively; and
   a cam actuator extending through said cover and base to actuate the cover to slide on the base, the cam actuator including a retention disk, a central disk, a cam disk, a transition disk, and a driving disk from down to up, the retention disk and the central disk being coaxial and located in the base, the cam disk, the transition disk, and the driving disk being coaxial and located in the cover, the cam actuator rotating on an axis of the central disk and an axis of the cam disk being parallel to but offset from the axis of the central disk, a diameter of the transition disk being less than a diameter of the driving disk and more than a diameter of the cam disk.

2. The electrical connector according to claim 1, wherein the retention disk engages with a washer to secure the cam actuator in the electrical connector.

3. The electrical connector according to claim 1, wherein the transition disk has a cylinder surface.

4. The electrical connector according to claim 1, wherein the transition disk has a circular conical surface.

5. The electrical connector according to claim 1, wherein the diameters of the retention disk, the central disk, the cam disk, the transition disk, and the driving disk are progressively increased.

6. An electrical connector comprising:
   an insulative base;
   a cover mounted on the base and defining a plurality of passageways;
   a plurality of conductive terminals secured to the base and disposed in the corresponding passageways of the cover, respectively; and
   a cam actuator extending through said cover and base to actuate the cover to slide on the base, the cam actuator including a retention disk, a central disk, a cam disk, a transition disk, and a driving disk from down to up, the retention disk and the central disk being coaxial and located in the base, the cam disk, the transition disk, and the driving disk being coaxial and located in the cover, the cam actuator rotating on an axis of the central disk and an axis of the cam disk being offset from the axis of the central disk, the cam disk contacting with the cover and a gap being formed between the transition disk and the cover.

7. The electrical connector according to claim 6, wherein the retention disk engages with a washer to secure the cam actuator in the electrical connector.

8. The electrical connector according to claim 6, wherein the transition disk has a cylinder surface.

9. The electrical connector according to claim 6, wherein the transition disk has a circular conical surface.

10. The electrical connector according to claim 6, wherein diameters of the retention disk, the central disk, the cam disk, the transition disk, and the driving disk are progressively increased.

11. An electrical connector comprising:
    an insulative base defining a small through hole with a round configuration thereof;
    an insulative cover mounted upon the base and moveable relative to the base in a front-to-back direction, said cover defining a large through hole with a non-circle configuration thereof; and
    a cam actuator extending through both said small through hole and said large through hole, said cam actuator including an upper section dimensioned and received in the large through hole and a lower section dimensioned and received in the small through hole; wherein
    the upper section defines an upper half and a lower half respectively received in an upper half and a lower half of the large through hole under condition that an average diameter of the upper half is larger than that of the lower half; and wherein
the upper half is chamfered structure relative to the lower half.

12. The electrical connector as claimed in claim 11, wherein the large through hole defines a contour compliantly similar to that of the upper section.

13. The electrical connector as claimed in claim 12, wherein the upper half is a stepped structure relative to the lower half.

14. The electrical connector as claimed in claim 12, wherein the cam actuator includes a head at a top end thereof and connected with the upper section.

\* \* \* \* \*